US006705506B1

(12) United States Patent
Sund

(10) Patent No.: US 6,705,506 B1
(45) Date of Patent: Mar. 16, 2004

(54) INERT ATMOSPHERE SOLDERING APPARATUS

(76) Inventor: William Sund, 150 Connie Crescent, Concord, Ontario (CA), L4K 1L9

( * ) Notice: Subject to any disclaimer, the term of this patent is extended or adjusted under 35 U.S.C. 154(b) by 0 days.

(21) Appl. No.: 09/567,086

(22) Filed: May 8, 2000

(51) Int. Cl.[7] ................................................. B23K 1/00
(52) U.S. Cl. ........................... 228/42; 228/56.1; 228/42
(58) Field of Search ........................ 228/42, 49.6, 56.1, 228/180.1, 259, 40

(56) References Cited

U.S. PATENT DOCUMENTS 3,058,441 A * 10/1962 Walker et al.
3,815,806 A * 6/1974 Paxton
3,866,307 A * 2/1975 Pfahl, Jr. et al.
4,113,165 A * 9/1978 Ott
4,779,790 A * 10/1988 Wallgren et al.
4,805,831 A * 2/1989 Lipschutz
5,024,366 A * 6/1991 Kim
5,335,843 A * 8/1994 Sund
5,439,158 A * 8/1995 Sund

* cited by examiner

Primary Examiner—Tom Dunn
Assistant Examiner—Jonathan Johnson

(57) ABSTRACT

A printed circuit board soldering process where a number of pockets containing solder are filled to overflowing with solder and then raised to immerse the terminals to be soldered. The solder pot and the pockets are protected by an atmosphere of hot inert gas introduced under a cover plate which has openings, corresponding to the location of the terminals, through which the pockets pass.

6 Claims, 5 Drawing Sheets

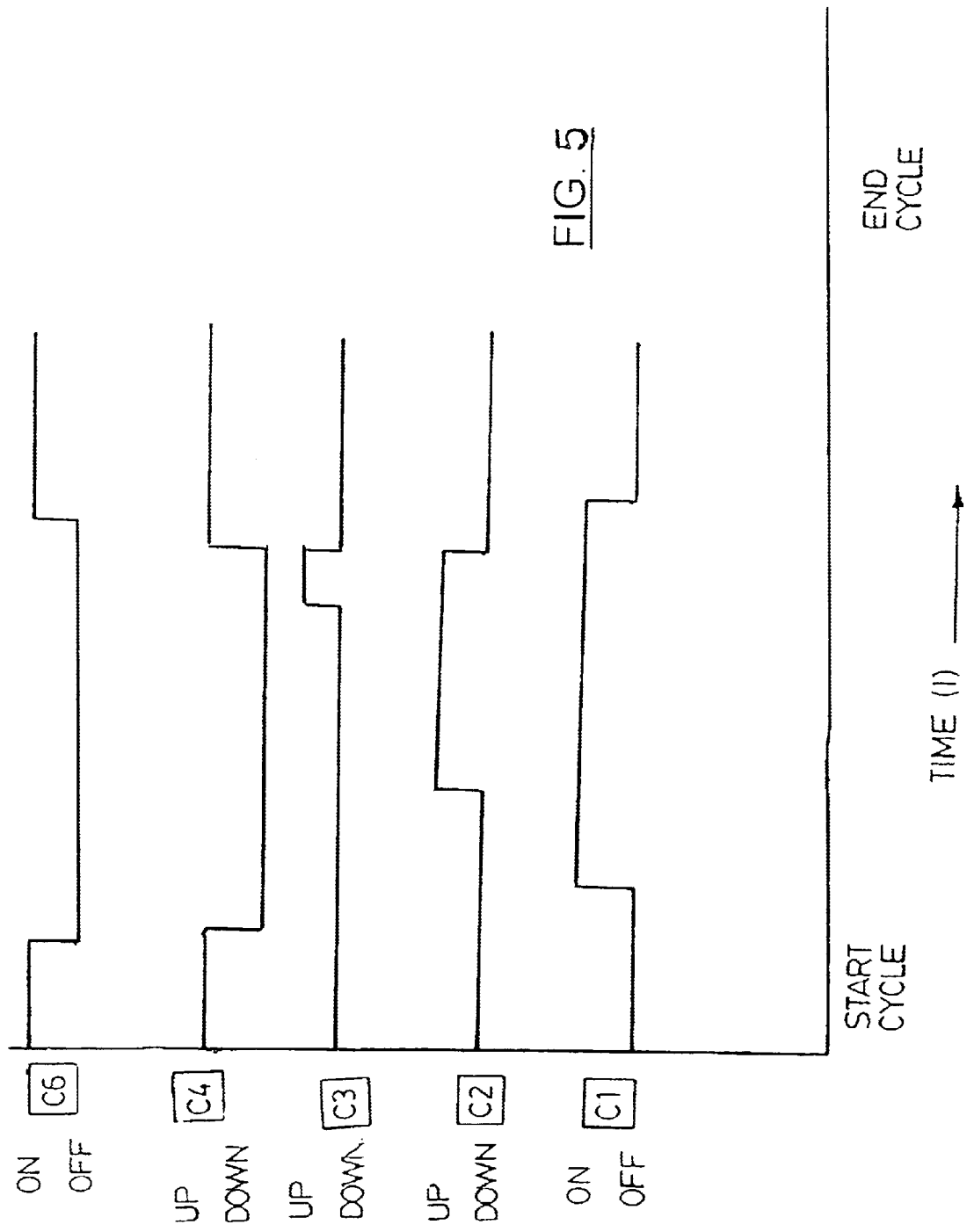

INERT ATMOSPHERE SOLDERING APPARATUS

FIELD OF THE INVENTION

This invention relates to a soldering process and apparatus and in particular to an inert atmosphere spot soldering process and apparatus.

BACKGROUND OF THE INVENTION

In my prior U.S. Pat. No. 5,439,158 I disclosed a soldering system having a controlled atmosphere bathing the solder pot and all liquid solder surfaces. In my prior U.S. Pat. No. 5,335,843 I disclosed a spot soldering apparatus which controlled the solder level and immersion of the leads by the meniscus formed by solder in pockets in which the terminals were then immersed.

In some situations the terminals to be soldered may be scattered around a printed circuit board and require a multiplicity of pockets properly located to solder a number of terminals substantially simultaneously. At the same time it is desirable that the pockets, terminals and solder surfaces be protected by an inert atmosphere as efficiently as possible.

In soldering terminals which are close together bridging may occur, that is adjacent terminals may be unintentionally connected by a solder bridge. A process which reduces this tendency is most desirable.

Flux is normally applied to areas to be soldered and the flux may contain volatiles or moisture which are desirably driven off before the terminals are soldered. The current move to volatile free fluxes makes this particularly important since water is now a common ingredient.

Solder balls are also produced in some processes and any reduction in their formation is desirable.

SUMMARY OF THE INVENTION

In accordance with the present invention a PC board (a printed circuit board) is delivered by a conveyer line to a solder station which is provided with pockets arranged to conform to the terminal arrangement, some times referred to as the "foot print" of the printed circuit. Each pocket is arranged to be filled to overflowing with molten solder. An atmosphere of hot inert gas is provided to cover the surface of the solder at all times. To economize on the flow of inert gas a cover is provided in the form of a box with its lower open end immersed in the solder and its upper surface provided with apertures conforming to the "footprint" so that pockets or terminals can enter the apertures and be surrounded with a flow of inert gas. In addition the terminals are exposed to the hot gas prior to soldering, preheating the area and driving off moisture and volatiles and minimizing production of solder balls The atmosphere of hot inert gas is continued after soldering, minimizing oxidation and bridging between terminals.

Also, to minimize bridging, the board is not raised vertically but is tilted as it is raised causing the solder to peel back while it is exposed to the hot inert atmosphere and thus maintained fluid.

A clearer understanding of my invention may be had from a consideration of the following description and drawings in which:

BRIEF DESCRIPTION OF THE DRAWINGS

FIG. 5 is a sequence chart showing the time relationship of the various steps of the process.

DESCRIPTION OF THE PREFERRED EMBODIMENT

Figure 1:
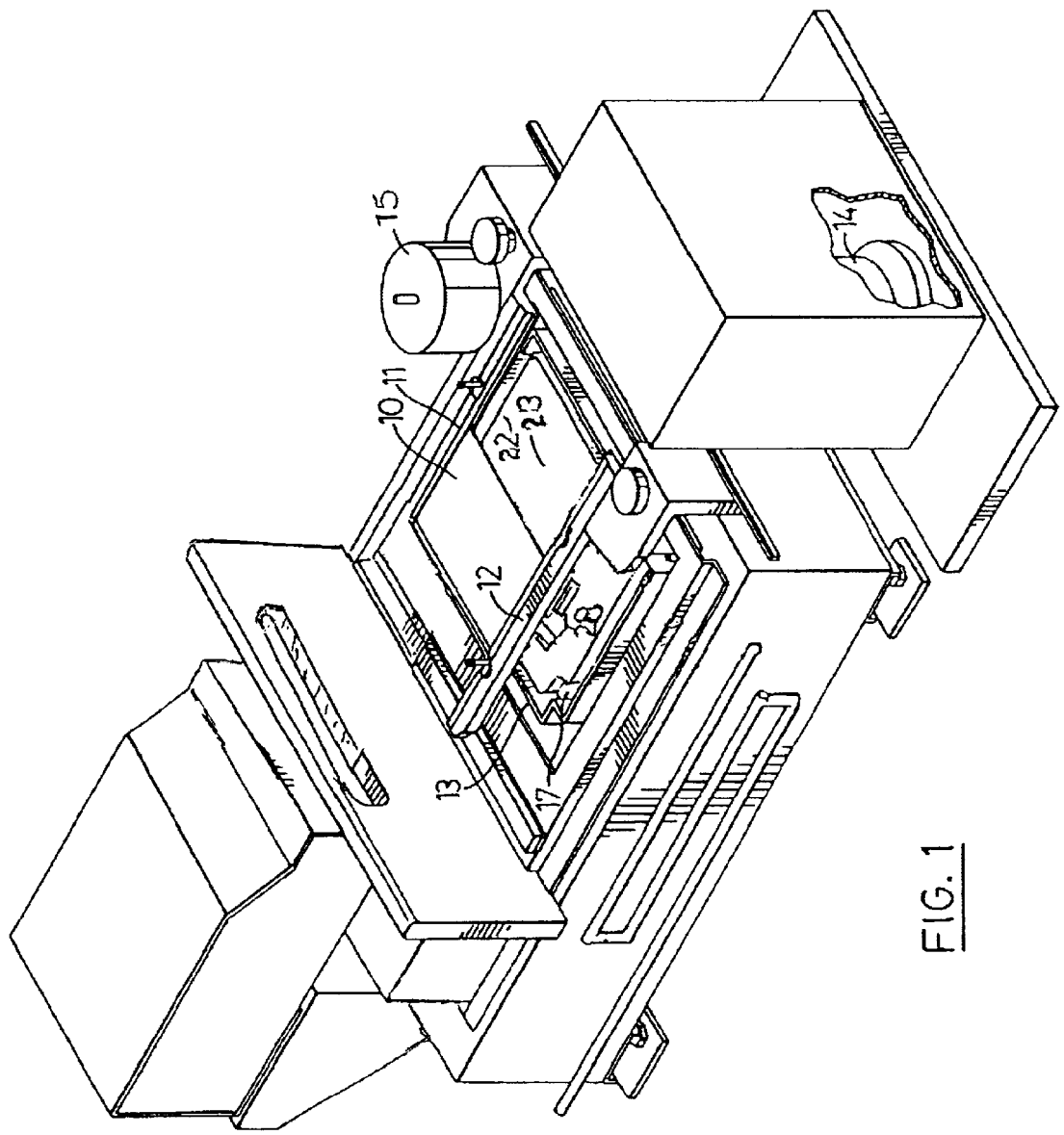
FIG. 1 is an isometric view of a solder station in accordance with my invention.
Figure 2:
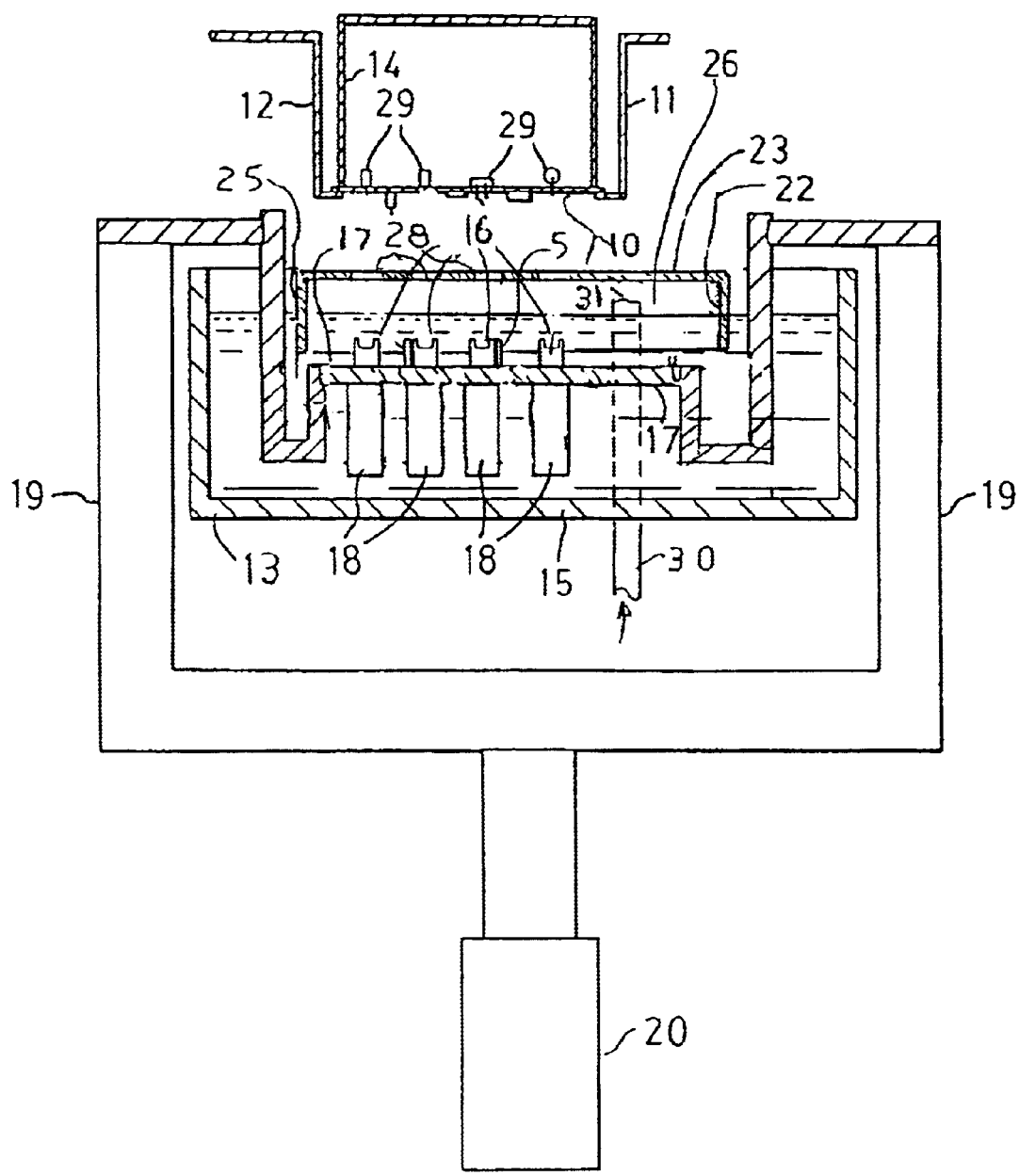
FIG. 2 is a sectional view of the solder station at the first step of the the process.
Figure 3:
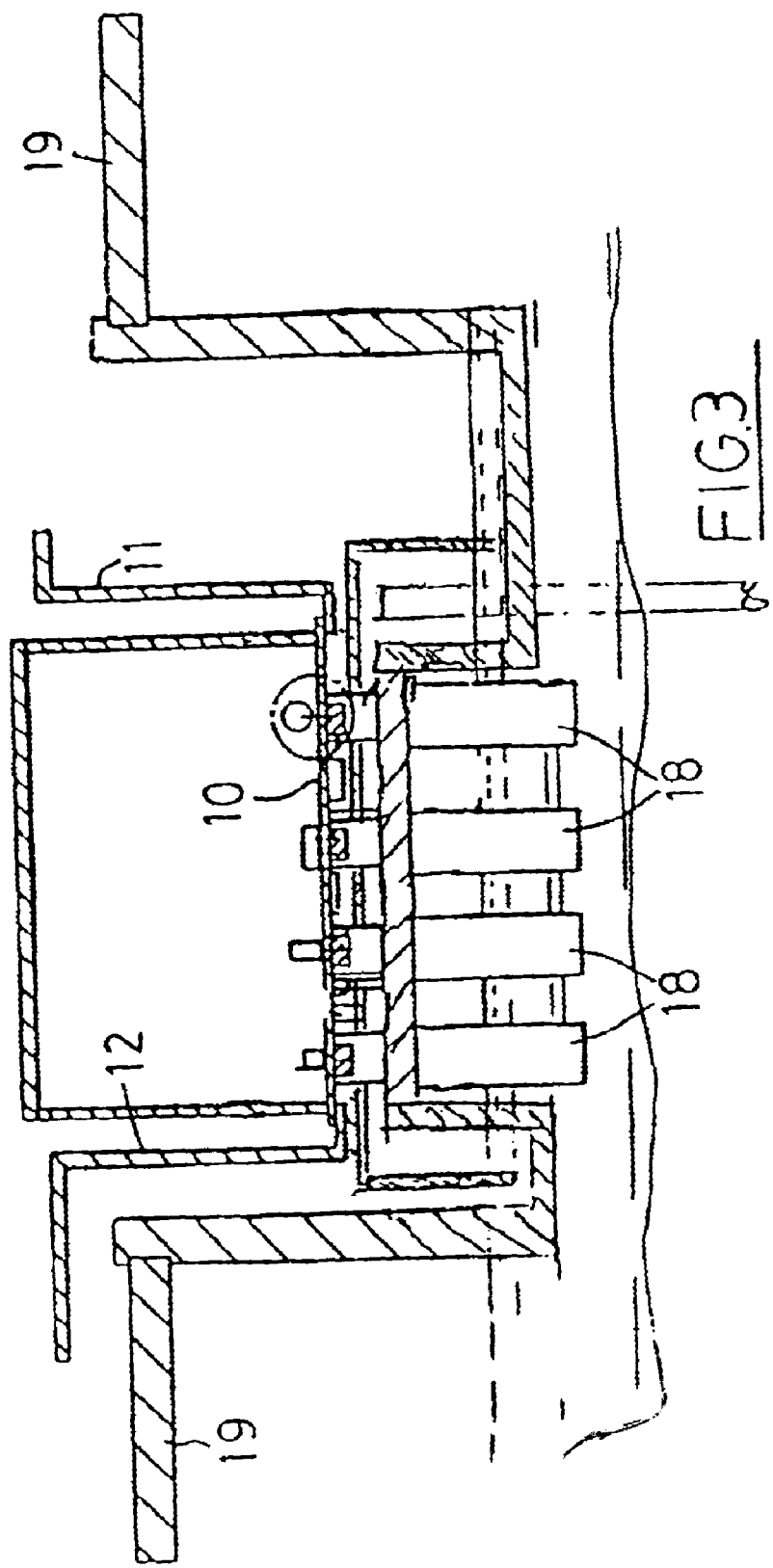
FIG. 3 is a sectional view of the solder station of FIG. 1 at the next step of the process.

Considering FIGS. 1 to 3, FIG. 1 shows in projection and FIG. 2 in section, the various elements of a solder station in accordance with my invention. The station is intended to be included in a soldering line of the same general type as the one illustrated in U.S. Pat. No. 5,439,158. The PC (printed circuit) board 10 to be soldered is delivered to the solder station by any suitable conveyer system and held in place on rails 11 and 12 when properly located over solder pot 13. The vertical position of rails 11 and 12 is adjustable by stepper motors 14 and 15. Stepper motor 14 raises and lowers the rails 11 and 12 relative to the solder pot while stepper motor 15 tilts the rails 11 and 12 relative to the solder pot 13.

A number of pockets 16 are mounted on a solder plate 17 and arranged to conform to the footprint of the PC board 10 to be soldered. The solder plate 17 is supported within the solder pot 13 by a movable yoke 19 mounted on an actuator 20 which is arranged to raise and lower the solder plate 17 within the solder pot 13. Each pocket includes a heat sink 18 thermally connected to the pocket and constantly immersed in the solder.

Adjacent each solder pocket there is a standoff 57, made of a poor thermally conducting material which rise slightly above the top of the solder pocket. A cover, comprising a horizontal top plate 23 and essentially vertical sides 22, 25, 26 and 27 (not shown) which together form a open ended box, completely encloses the 30 surface of the solder which includes the solder pockets with the top plate above the level of the solder and with the side walls immersed in the solder. Plate 23 has openings 28 which conform to the footprint of the printed circuit board.

OPERATION

As may be seen in FIG. 2, with the actuator 20 de-energized the tops of the pockets 16 are below the level of the solder, which is maintained molten in the solder pot 13 at the desired temperature by the usual heat control system. A flow of hot inert gas, such as nitrogen is supplied though riser 30 flooding the whole area enclosed by the box formed by plate 23 and sides 22, 25 26 and 27 above the solder and flowing out through the openings 28. in the top plate 23 The conveyer system (not shown) moves the PC board 10 into position on rails 11 and 12 where it is held in position by pins 14. The rails are then lowered by stepper motor 14 until the PC board 10 almost touches plate 23. The terminals to be soldered are aligned with the openings 28 and are thus exposed to a continuing flow of hot gas which removes surplus volatiles and pre-heats the terminals. Actuator 20 is now activated raising solder plate 17 as shown in FIG. 3 and the pockets 16 now rise above the surface of the solder in the solder pot 13, filled to overflowing and having a meniscus of solder at their upper ends. The pockets pass through the openings 28 and immerse the terminals in the solder in the pockets 16 to a depth determined by the meniscus, but limited by the standoff 57 which contacts the PC board 10 and prevents the pocket 16 from contacting and damaging the printed circuit.

After the terminals have been immersed in solder a sufficient time to ensure they are properly joined, stepper motor 15 tilts the rails lifting the terminals out of the solder. Actuator 20 lowers the solder plate 17 to the position shown in FIG. 2 while the flow of inert gas continues. The solder is permitted to solidify on the terminals while exposed to the inert gas. The PC board 10 is then raised to its original position and proceeds to the next station and a new PC board is presented to the solder station for processing.

Figure 4:
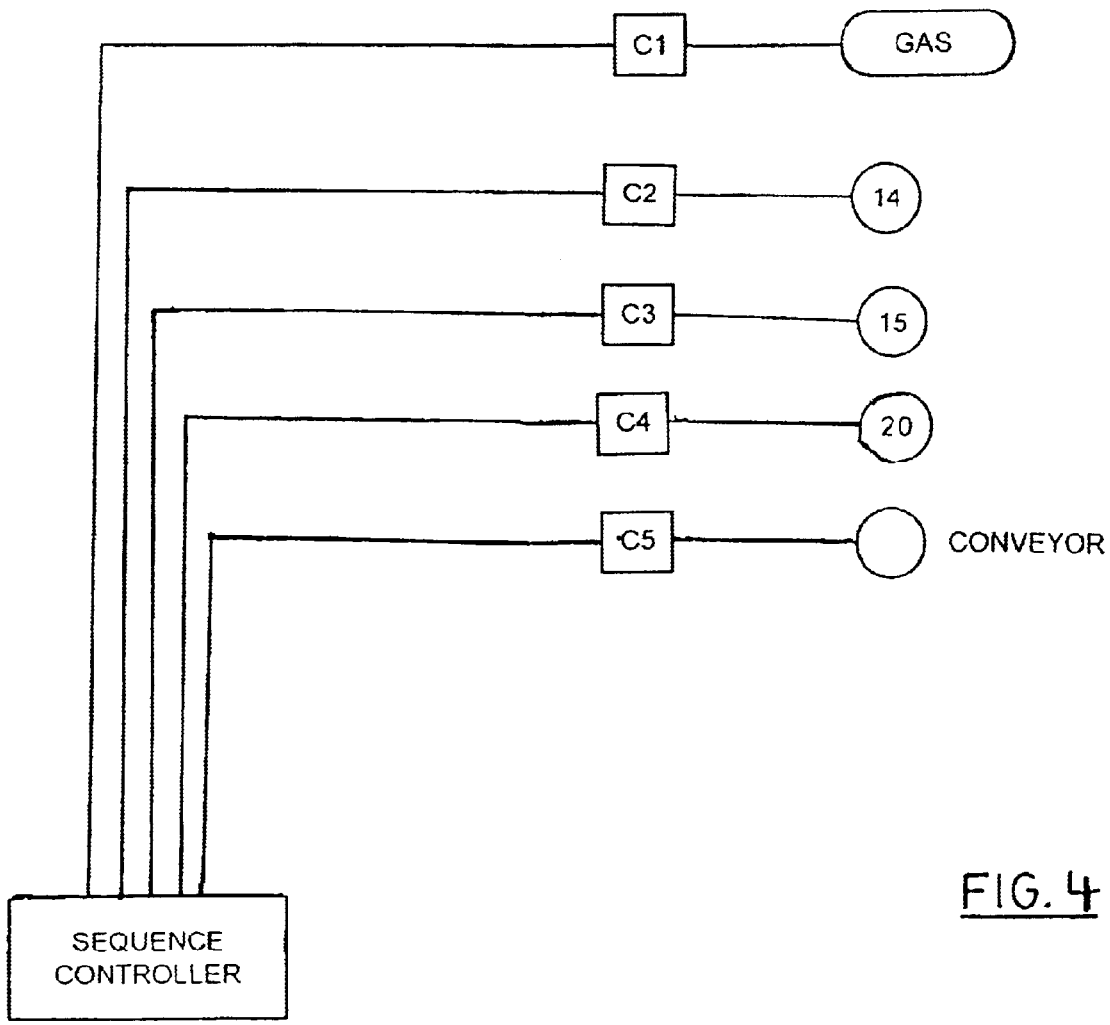
FIG. 4 is a simplified schematic diagram of the control system for the various motors of the system.

Considering FIGS. 4 and 5 the preceding sequence is further illustrated. The sequence controller activates the controls C1 to C5 in sequence first stopping the conveyer by deactivating control C5. Next the PC is lowered to the position shown in FIG. 3 by activating controller C2 and thus motor 14. Controller C1 is activated increasing the flow of inert gas. Next the pockets 16 are raised by activating controller C4 and thus operator 20. After sufficient time elapses to permit complete soldering the sequence controller activates controller C3 and thus motor 15 causing the PC to tilt raising one end away from the pockets. Next C2 is activated to reverse the direction of motor 14 and raise the PC board. At the same time C4 is deactivated and actuator 20 lowers the pockets to the position shown in FIG. 2. C1 is deactivated and gas flow is reduced or terminated. The sequence is now complete and the next board may be presented and processed.

It will be noted that the use of solder pockets such as pockets 16 permit soldering terminals which lie adjacent a surface mounted or through hole device which is on the lower surface of the PC board, without such devices being contacted by the molten solder.

While the apparatus has been shown in some detail it will be understood that numerous variations of the structures could be arranged to function in a substantially similar manner. The exact apparatus would depend upon the nature of the device being soldered. For example,while it has been described as designed to spot solder terminals on a PC board, it could be designed to spot solder any arrangement of terminals or devices which require precise, automated soldering. The provision of a hot inert atmosphere covering all solder surfaces and the sequencing of the various steps of the process can clearly have other applications.

As has been indicated the flow of inert gas may be continuous to keep the surface of the solder clean and the flow simply increased when the board is in position for soldering.

It will also be understood that, while the apparatus and process have been described as a soldering process, the equipment may also be used in a desoldering process where it is desired to remove one or more elements from a previously soldered board. It is only necessary to conform the pockets to the desired foot print and only the terminals of the element to be removed will be immersed in solder. The element may then be removed without damage to adjacent elements.

I claim:

1. A soldering apparatus comprising, a solder pot, heating means to maintain solder liquid within said pot, at least one cup mounted within said solder pot, a cover located above and covering the solder in said solder pot said cover comprising a top plate having at least one aperture coinciding in location with said cup, and side members joined to said top plate forming an open ended box with its open end facing down into said solder pot and the lower edges of said side members immersed in said liquid solder means to move a device which includes terminals to be soldered to a first position over said solder pot and above said top plate with said terminals directly above said aperture, means to supply heated inert gas below said top plate and fill said box, means to fill said cup to overflowing with liquid solder from said pot, means to move said device downwards to a second position where said terminals project down through said aperture and are exposed to said heated inert gas, means to raise said cup to a position where said terminals are immersed in said liquid solder in said cup and means to raise said device to its first position.

2. A soldering apparatus as claimed in claim 1 wherein the flow of gas supplied is increased when said device is moved to its second position.

3. A soldering apparatus comprising, a solder pot, heating means to maintain solder liquid within said pot, means to move a printed circuit board including terminals to be soldered to a first location above said solder pot, a cover over the solder in said pot comprising a top plate and side plates joined to said top plate forming an open ended box with its open end facing into said solder pot with said top plate below said printed circuit board and the lower edges of said sides immersed in said liquid solder at least one aperture in said top plate corresponding in location to a terminal on said printed circuit board, at least one cup mounted within said solder pot, means to fill said cup to overflowing with solder, means to move said printed circuit board to a second location with said terminal projecting through said aperture, means to supply a flow of hot inert gas below said top plate and above the level of said solder in said pot, means to raise said cup until said terminal is immersed in the solder contained in said cup, means to lower said cup, means to raise said printed board to its first position and means to reduce the flow of hot gas.

4. A soldering apparatus as claimed in claim 3 wherein said means to fill said cup with solder comprises means to lower said cup below the level of the solder in said pot.

5. A soldering apparatus as claimed in claim 3 including a plurality of apertures in said top plate and a plurality of cups, the location of said apertures and said cups corresponding to the foot print of said printed circuit board.

6. A soldering apparatus comprising, a solder pot, heating means to maintain solder liquid within said pot, at least one cup mounted within said solder pot, means to move a device which includes terminals to be soldered to a first position over said solder pot with said terminals directly above said cup, means to fill said cup to overflowing with liquid solder from said pot, means to raise said cup to a position where said terminals are immersed in said liquid solder in said cup, characterized in that a cover is located below said device and above and covering the solder in said solder pot said cover comprising a top plate having at least one aperture coinciding in location with said cup, and side members joined to said top plate forming an open ended box with its open end facing down into and immersed in the solder in said solder pot, means to supply heated inert gas below said top plate and fill said box, means to move said device downwards to a second position where said terminals project down through said aperture and are exposed to said heated inert gas prior to immersion in the solder in said cup, and means to move said device to its first position.

* * * * *